US008928859B2

(12) United States Patent
Fiolka et al.

(10) Patent No.: US 8,928,859 B2
(45) Date of Patent: *Jan. 6, 2015

(54) ILLUMINATION SYSTEM OF A MICROLITHOGRAPHIC PROJECTION EXPOSURE APPARATUS

(75) Inventors: Damian Fiolka, Oberkochen (DE); Manfred Maul, Aalen (DE); Markus Schwab, Aalen (DE); Wolfgang Seitz, Rainau (DE); Olaf Dittmann, Bopfingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 290 days.

This patent is subject to a terminal disclaimer.

(21) Appl. No.: 13/564,419

(22) Filed: Aug. 1, 2012

(65) Prior Publication Data
US 2012/0293786 A1    Nov. 22, 2012

Related U.S. Application Data

(63) Continuation of application No. 12/496,762, filed on Jul. 2, 2009, now Pat. No. 8,264,668, which is a continuation of application No. PCT/EP2007/060360, filed on Oct. 1, 2007.

(30) Foreign Application Priority Data

Mar. 2, 2007 (DE) .................. 10 2007 010 650

(51) Int. Cl.
G03B 27/72    (2006.01)
G02B 27/28    (2006.01)
G03F 7/20     (2006.01)
G02B 3/00     (2006.01)

(52) U.S. Cl.
CPC .......... *G02B 27/286* (2013.01); *G03F 7/70566* (2013.01); *G02B 3/0056* (2013.01)
USPC ........................................ 355/71

(58) Field of Classification Search
USPC ......................... 355/67, 71; 362/19
See application file for complete search history.

(56) References Cited

U.S. PATENT DOCUMENTS 5,253,110 A   10/1993 Ichihara et al.
6,252,712 B1   6/2001 Fuerter et al.
(Continued)

FOREIGN PATENT DOCUMENTS

EP   0 937 999 A1   8/1999
EP   1 681 710      7/2006
(Continued)

OTHER PUBLICATIONS

Korean Office Action, with English translation, for corresponding KR Appl No. 10-2012-7022527, dated Sep. 17, 2013.
(Continued)

*Primary Examiner* — Glen Kao
(74) *Attorney, Agent, or Firm* — Fish & Richardson P.C.

(57) ABSTRACT

The disclosure relates to an illumination system of a microlithographic projection exposure apparatus. The illumination system can include a depolarizer which in conjunction with a light mixing system disposed downstream in the light propagation direction at least partially causes effective depolarization of polarized light impinging on the depolarizer. The illumination system can also include a microlens array which is arranged upstream of the light mixing system in the light propagation direction. The microlens array can include a plurality of microlenses arranged with a periodicity. The depolarizer can be configured so that a contribution afforded by interaction of the depolarizer with the periodicity of the microlens array to a residual polarization distribution occurring in a pupil plane arranged downstream of the microlens array in the light propagation direction has a maximum degree of polarization of not more than 5%.

20 Claims, 8 Drawing Sheets

(56) References Cited

U.S. PATENT DOCUMENTS

| | | | |
|---|---|---|---|
| 6,424,404 | B1 | 7/2002 | Johnson |
| 6,535,273 | B1 | 3/2003 | Maul |
| 8,264,668 | B2 * | 9/2012 | Fiolka et al. ............... 355/71 |
| 2001/0052968 | A1 | 12/2001 | Shiozawa |

FOREIGN PATENT DOCUMENTS

| | | |
|---|---|---|
| JP | 3-016114 | 1/1991 |
| JP | 2001-284228 | 10/2001 |
| JP | 2002-520810 | 7/2002 |
| JP | 2006 039076 A | 2/2006 |
| JP | 2006-210471 | 8/2006 |
| JP | 2006-269853 | 10/2006 |
| KR | 10-2001-0053240 | 6/2001 |
| WO | WO 00/02092 | 1/2000 |
| WO | WO 2004/104654 | 12/2004 |
| WO | WO 2006/131517 | 12/2006 |

OTHER PUBLICATIONS

Korean Office Action, with translation thereof, for KR Appl No. 10-2012-7022527, dated May 29, 2014.
The International Search Report and a Written Opinion from the counterpart PCT Application No. PCT/EP2007/060360, filed Oct. 1, 2007.
The European Office Action Report for the corresponding EP Application No. 07 820 745.3, dated May 20, 2010.
The International Preliminary Report on Patentability from the counterpart PCT Application No. PCT/EP2007/060360, dated Sep. 17, 2009.
Japanese Office Action, with English translation, for corresponding Appl No. 2009-552076, dated Aug. 19, 2011.
The Extended European Search Report for corresponding EP Appl No. 12156900.8-2217, dated Apr. 19, 2012.
Korean Office Action, with translation thereof, for KR Appl No. 10-2012-7022528, dated Sep. 30, 2014.

* cited by examiner

Fig. 2
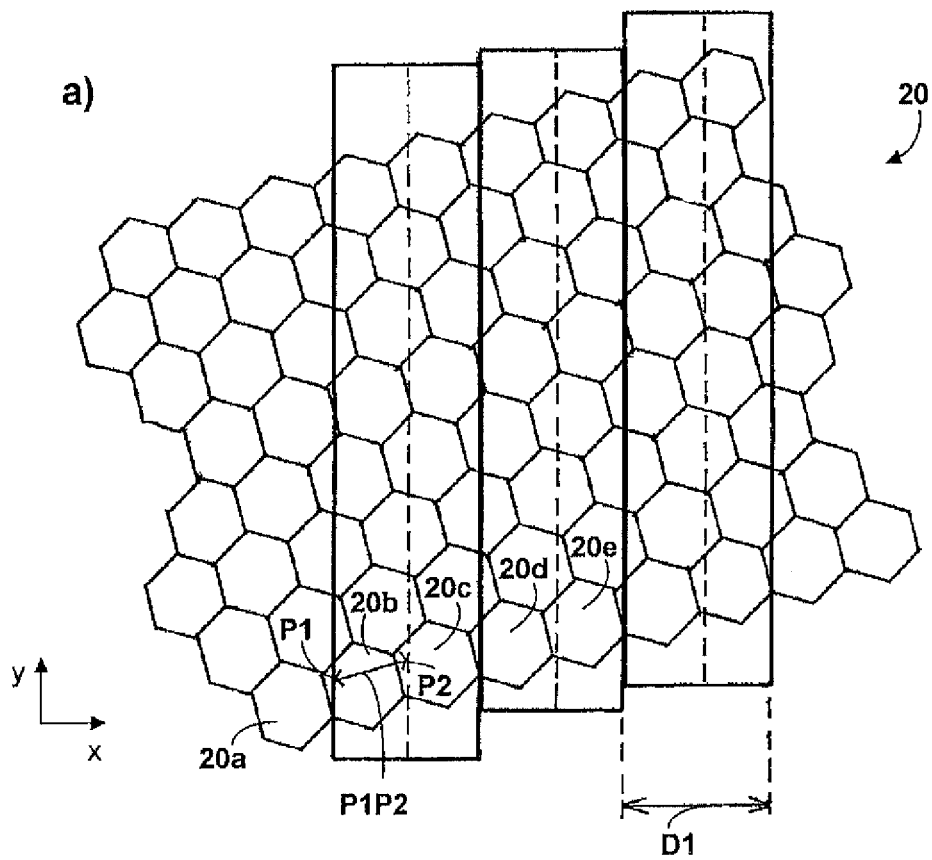
a)
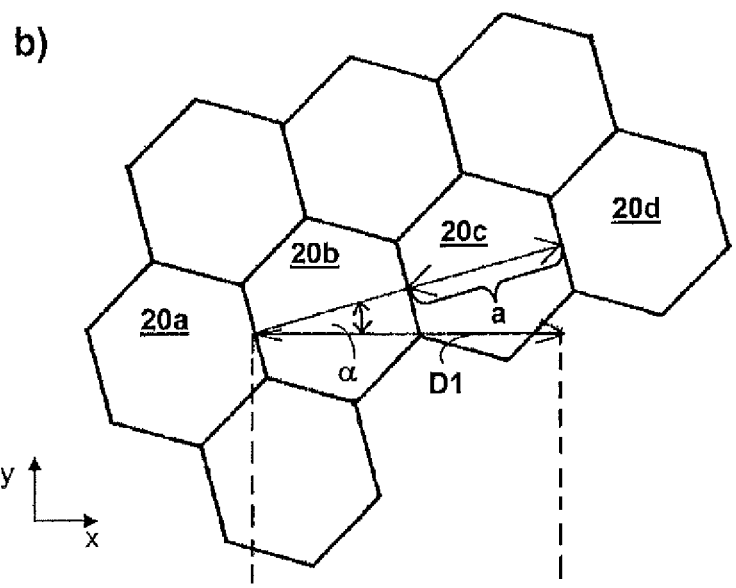
b)

Fig. 7
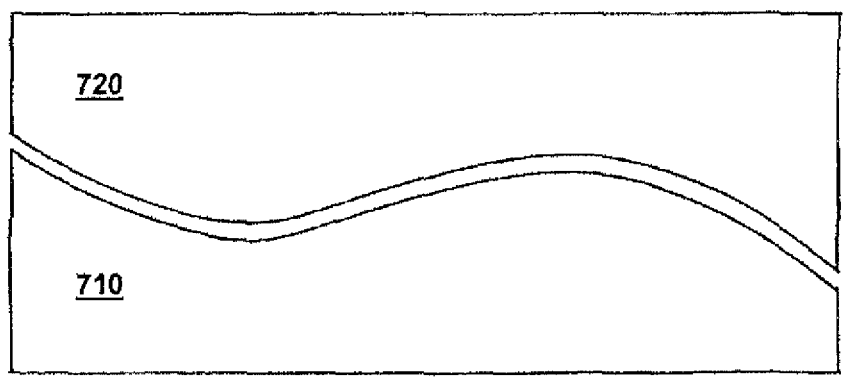
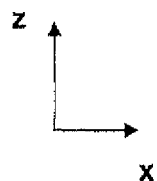

ILLUMINATION SYSTEM OF A MICROLITHOGRAPHIC PROJECTION EXPOSURE APPARATUS

CROSS-REFERENCE TO RELATED APPLICATIONS

This application is a continuation of, and claims benefit under 35 USC 120 to, U.S. application Ser. No. 12/496,762, filed Jul. 2, 2009, now U.S. Pat. No. 8,264,668, which is a continuation of, and claims benefit under 35 USC 120 to, international application PCT/EP2007/060360, filed Oct. 1, 2007, which claims benefit of German Application No. 10 2007 010 650.7, filed Mar. 2, 2007. Ser. No. 12/496,762 and international application PCT/EP2007/060360 are hereby incorporated by reference in their entirety.

FIELD

The disclosure relates to an illumination system of a microlithographic projection exposure apparatus, including such a system in which substantially unpolarised light is wanted and in which a local variation in the residual polarisation distribution contained in a pupil plane of the illumination system can be substantially or completely eliminated.

BACKGROUND

Microlithography is commonly used for the production of microstructured components, such as, for example, integrated circuits or LCDs. The microlithography process is often carried out in what is referred to as a projection exposure apparatus having an illumination system and a projection objective. The image of a mask illuminated by the illumination system (reticle) is in case projected by the projection objective onto a substrate (e.g., a silicon wafer) which is coated with a light-sensitive layer (photoresist) and arranged in the image plane of the projection objective to transfer the mask structure onto the light-sensitive coating on the substrate.

It is known for linearly polarised light from a laser source to be depolarised by a Hanle depolariser and a light mixing system arranged downstream of the Hanle depolariser. Such a Hanle depolariser can include at least a first wedge plate of birefringent material transparent to light of the working wavelength and typically also a second wedge plate which compensates for the beam deflection of the first wedge plate and which is made from birefringent or non-birefringent material which is transparent to light of the working wavelength. The first wedge plate of the Hanle depolariser is usually arranged in such a way that the angle between the optical crystal axis of the birefringent material and the vibration direction of the electrical field strength vector of the linearly polarised light from the laser source is substantially 45°.

SUMMARY

In some embodiments, the disclosure provides an illumination system of a microlithographic projection exposure apparatus in which a local variation in the residual polarisation distribution involved in a pupil plane of the illumination system can be substantially or completely eliminated.

In certain embodiments, the disclosure provides an illumination system that includes a depolariser which in conjunction with a light mixing system disposed downstream in the light propagation direction at least partially causes effective depolarisation of polarised light impinging on the depolariser. The illumination system also includes a microlens array which is arranged upstream of the light mixing system in the light propagation direction and in which a plurality of microlenses are arranged with a periodicity. The depolariser is such that a contribution afforded by interaction of the depolariser with the periodicity of the microlens array to a residual polarisation distribution occurring in a pupil plane arranged downstream of the microlens array in the light propagation direction has a maximum degree of polarisation of not more than 5%.

In some embodiments, the contribution to the residual polarisation distribution occurring in a pupil plane arranged downstream of the microlens array in the light propagation direction has a maximum degree of polarisation of not more than 2% (e.g., not more than 1%).

The degree of polarisation or DOP value (DOP="degree of polarisation") is defined as the ratio of the intensity of the polarised light component to the intensity of the overall light, that is to say the following applies:

$$DOP = \frac{\sqrt{s_1^2 + s_2^2 + s_3^2}}{s_0} \quad (1)$$

wherein $s_1$, $s_2$, $s_3$ and $s_0$ denote the Stokes parameters of the Stokes vector describing the polarisation state.

The DOP value is respectively calculated at a pupil point from the average value of the values surrounding that pupil point ("moving convolution"), where as the range for averaging it is possible to select a circular range whose diameter is about 10 percent of the maximum pupil diameter.

The disclosure is based, in part at least, on the realisation that, a combination of a depolariser used in the illumination system for effective light mixing with a microlens array used to produce an angular distribution, wherein the depolariser and the microlens array are each arranged in front of a pupil plane of the illumination system, the light beams passing through the microlens array involve mutually different polarisation states in dependence on the polarisation-influencing action respectively achieved for those light beams by the depolariser. Without suitable measures the superpositioning of those polarisation states, which takes place in the pupil plane, can lead to a residual polarisation distribution with a degree of polarisation which varies locally or in dependence on the respective position in the pupil plane.

A suitable design configuration with respect to the depolariser can counteract the unwanted differences, which occur due to the foregoing interaction between the periodicity of the microlens array and the depolariser in the contribution to the polarisation distribution which occurs in the pupil plane so that as a result ideally there is no contribution (or an only minimal or homogenous contribution) to the residual polarisation distribution in the pupil plane. In some embodiments, moiré effects by virtue of the interaction of the depolariser with the periodicity of the microlens array are almost entirely or completely prevented.

In certain embodiments, the disclosure provides a microlithographic projection exposure apparatus that includes a depolariser which in conjunction with a light mixing system disposed downstream in the light propagation direction at least partially causes effective depolarisation of polarised light impinging on the depolariser. The apparatus also includes a microlens array which is arranged upstream of the light mixing system in the light propagation direction and in which a plurality of microlenses are arranged with a periodicity. The depolariser is such that a contribution afforded by interaction of the depolariser with the periodicity of the microlens array to a residual polarisation distribution occurring in a pupil plane arranged downstream of the microlens array in the light propagation direction is substantially homogenous over the pupil plane.

In some embodiments, the depolariser produces a succession, which is periodic over its cross-section, of mutually orthogonal polarisation states. The periodic succession can be adapted to the periodicity of the microlens array in such a way that at least two (and optionally all) light beams which within the microlens array pass through mutually adjacent microlenses at positions whose spacing from each other corresponds to an integral multiple of the periodicity of the microlens array bear mutually orthogonal polarisation states.

In certain embodiments, the superpositioning, implemented by the periodicity of the microlens array, of beams in the pupil plane, which pass through the individual microlenses of the microlens array at mutually corresponding positions (that is to say at identical "relative positions") is used specifically to obtain superpositioning in the pupil plane to afford effectively unpolarised light, by way of the setting of orthogonal polarisation states for those beams. In that respect, here and hereinafter the expression "mutually corresponding positions" within different microlenses of the microlens array is used to denote those positions which are spaced from each other by an integral multiple of the periodicity of the microlens array.

In certain embodiments, suitable matching of the "depolarisation period" of the depolariser (that is to say the period with which a repeat of the polarisation state set by the depolariser occurs over the depolariser cross-section in the plane perpendicular to the light propagation direction or to the optical system axis of the illumination system) to the periodicity of the microlens array is effected, as the aforementioned depolarisation period is determining as to which light beams passing through the microlens array bear which polarisation state.

The expression "mutually orthogonal polarisation states" is used to denote not just linear polarisation states with preferred polarisation directions which are rotated through 90° relative to each other but also circular polarisation states of opposite handedness (that is to say left-circularly and right-circularly polarised light).

In some embodiments, the depolariser is produced from birefringent material and has a thickness profile which varies over its cross-section perpendicularly to the optical system axis of the illumination system. Here, the term birefringent material shall cover both materials which show linear birefringence as well as materials which show circular birefringence (i.e. optical activity).

In certain embodiments, the depolariser is so designed that, in a plane perpendicular to the optical system axis of the illumination system, it produces mutually orthogonal polarisation states whose distribution within the optically effective range does not involve any periodicity. The depolarising action of the depolariser can be such from the outset that there is no association, which leads to a periodic superpositioning effect, between the polarisation states (or polarisation stripes) which are set by the depolariser and the respective positions on the microlenses of the microlens array so that beams which experience the same retardation effect in the depolariser pass through the individual microlenses of the microlens array at different relative positions (that is to say at positions which are not spaced from each other by an integral multiple of the periodicity of the microlens array).

In some embodiments, an association, which leads to a periodic superpositioning effect, between the polarisation states set by the depolariser and the respective corresponding positions on the microlenses of the microlens array can be achieved by the variation in the polarisation state, which is produced by the depolariser, being set aperiodically. Furthermore the effect which can be desired here, that light beams with identical polarisation state which is set by the depolariser pass through the microlenses of the microlens array at different relative positions can also be achieved by lines of equal retardation of the depolariser extending not straight but curved or on an arc, as is described in greater detail hereinafter.

In certain embodiments, the disclosure provides a microlithographic projection exposure apparatus, a process for the production of microlithographic components and a microlithographic component.

The disclosure is described in greater detail hereinafter by way of example illustrated in the accompanying drawings in which:

BRIEF DESCRIPTION OF THE DRAWINGS

FIGS. 2a-b show diagrammatic views to describe the configuration of the depolariser for reducing or avoiding the local variation involved as shown in FIG. 1 in the residual polarisation in the pupil plane;

FIGS. 5a, 5b, 6a, 6b, 7, 8, and 9 show diagrammatic views of depolarisers.

DETAILED DESCRIPTION

Figure 1:
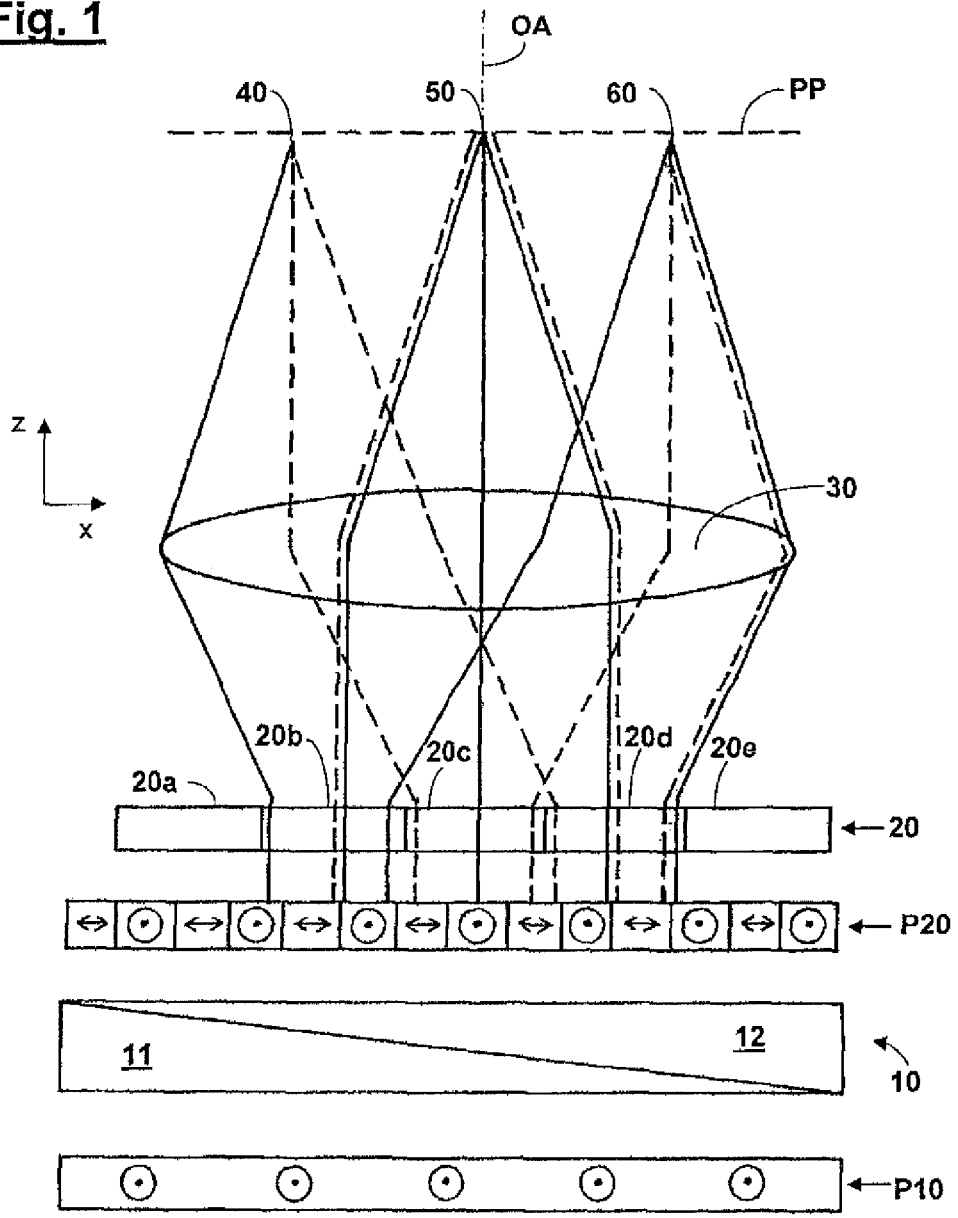
FIG. 1 shows a diagrammatic view to illustrate the occurrence of a local variation in residual polarisation in a pupil plane of the illumination system as a consequence of interaction between a depolariser and a microlens array.

FIG. 1 shows a diagrammatic view illustrating a portion of an illumination system for explaining the occurrence of a local variation in the residual polarisation in a pupil plane of the illumination system as a consequence of interaction between a depolariser and a microlens array.

Referring to FIG. 1 linearly polarised light whose preferred polarisation direction in the illustrated coordinate system points in the y-direction and which is produced by a laser light source (not shown), for example an argon fluoride laser with a working wavelength of about 193 mm) impinges on a Hanle depolariser 10 having a first wedge plate 11 and a second wedge plate 12. The wedge plates 11 and 12 are each made from birefringent material, for example from crystalline quartz or another suitable material which is transparent for light of the working wavelength. The second wedge plate 12 serves to compensate for beam deflection by the first wedge plate 11, for which reason its light exit surface which extends perpendicularly to the optical system axis OA is arranged in parallel relationship with the light entry surface of the first wedge plate 11 and its light entry surface which is inclined with respect to the optical system axis OA is arranged in parallel relationship with the inclined light entry surface of the first wedge plate 11.

Disposed downstream of the Hanle depolariser 10 in the light propagation direction (extending in the z-direction in the illustrated coordinate system) is a microlens array 20 which is shown in a plan view in FIG. 2 and which in accordance with the illustrated example is in the form of a Fresnel zone DOE including diffractive microlenses 20a, 20b, . . . arranged in a honeycomb structure, with an extent or period of about 1.7 mm. The microlens array 20 produces an angular distribution in the light beams which impinge in different polarisation states—as a consequence of the action of the depolariser 10. In that arrangement each individual cell of the Fresnel zone DOE is imaged onto the entire pupil plane PP, wherein points arranged in the individual cells or microlenses 20a, 20b, . . . relative to each other at corresponding positions are imaged onto the same position in the pupil plane PP. The light beams which impinge on those individual points and which pass through the Fresnel zone DOE at the respective location involve mutually different polarisation states in dependence on the respective effect produced at the position in question upstream of the Fresnel zone DOE by the depolariser 10. The superpositioning of those polarisation states in the pupil plane affords, without suitable measures, a position-dependent contribution to the residual polarisation distribution in the pupil plane.

FIG. 1 also shows a diagrammatic and greatly simplified view of the polarisation distribution which identified by P20 and which arises downstream of the Hanle depolariser 10 and upstream of the microlens array 20 in the light propagation direction. In this simplified view the polarisation distribution P20 includes stripes involving alternately mutually orthogonal polarisation states, wherein the period of that stripe pattern is less than that of the microlens array 20.

In this respect the polarisation distribution P20 obtained downstream of the Hanle depolariser 10 in the light propagation direction is shown in simplified form as a succession of linear polarisation states alternately in the x-direction and y-direction respectively. In actual fact the variation in the polarisation state over the extent of the Hanle depolariser occurs continuously in known manner, in which respect a periodically repeating succession of polarisation states is set in the wedge direction (that is to say in the x-direction in the illustrated coordinate system). In other words, starting from any position in the x-direction, after a constant distance which corresponds to half the periodicity or depolarisation period of the Hanle depolariser 10, the respective orthogonal polarisation state occurs.

Of the individual cells of the microlens array 20, the structure of which is described in greater detail hereinafter with reference to FIG. 2a-b, FIG. 1 shows five cells 20a-20e. The position of a pupil plane PP of the illumination system is also illustrated, wherein the lens system 30 disposed between the microlens array 20 and the pupil plane PP is illustrated by a single lens, for the sake of simplicity.

The diagrammatic view in FIG. 1 shows the beam configuration of three beam bundles 40, 50 and 60 which impinge on the pupil plane PP, those beam bundles being respectively composed of partial beams involving differing preferred polarisation directions, depending on the respective polarisation distribution P20 which is present upstream of the microlens array 20 and which is set by the Hanle depolariser 10. In that respect partial beams involving a preferred polarisation direction pointing in the x-direction are illustrated in FIG. 1 by broken lines whereas partial beams involving a preferred direction in the y-direction are illustrated in FIG. 1 by solid lines.

Counting off the partial beams, which impinge in the pupil plane PP, in the beam bundles 40, 50 and 60 shows that the beam bundle 40 is composed in the pupil plane PP of a partial beam which is polarised in the y-direction and two partial beams which are polarised in the x-direction so that that beam bundle 40 has an excess of polarisation in the x-direction. In contrast the beam bundle 50 is composed of two partial beams which are polarised in the x-direction and three partial beams which are polarised in the y-direction so that this beam bundle 50 has an excess of polarisation in the y-direction. The beam bundle 60 is composed of two partial beams which are polarised in the y-direction and two partial beams which are polarised in the x-direction. Accordingly, it is only that beam bundle 60 that does not have an excess of linear polarisation in the x-direction or the y-direction.

Consequently, as shown in FIG. 1, the interaction of the Hanle depolariser 10 with the microlens array 20 in the pupil plane PP affords a contribution to the residual polarisation distribution, which is modulated substantially in stripe form.

Hereinafter reference will firstly be made to FIG. 2a-b to describe in greater detail the structure of the microlens array 20. The microlens array 20 includes a plurality of microlenses 20a, 20b, 20c, . . . , which in the illustrated example are each of a hexagonal geometry, for filling the surface area involved.

The microlenses 20a, 20b, 20c, . . . can be both refractive and also diffractive and in the illustrated example are in the form of so-called Fresnel DOEs, of which each includes in basically known fashion a structure consisting of circularly and concentrically extending diffractive structures arranged with an increasing spacing from each other in a radially outward direction.

As can also be seen from FIG. 2a-b the microlens array 20 in the illustrated example is arranged with its longitudinal direction of the microlenses 20a, 20b, 20c, . . . not in parallel relationship with the x-axis but rotated through an angle of 15° relative to the x-axis about the optical system axis OA (extending in the z-direction). The only purpose of that rotated arrangement of the honeycomb structure of the microlens array with respect to the x-axis is to achieve an improved approximation to a circular illumination setting, having regard to a subsequent light mixing effect which occurs in the illumination system, by a so-called integrator bar. It will be appreciated however that the disclosure is not restricted to the illustrated rotated arrangement of the honeycomb structure of the microlens array 20 with respect to the x-axis, but alternatively the microlens array 20 can be arranged at a different rotational angle (including 0°, that is to say without rotation) in relation to the x-axis.

FIG. 2a also shows two points P1 and P2, the straight line joining those points P1 and P2 being identified by P1P2. As the individual microlenses 20a, 20b, 20c, . . . of the microlens array 20 are identical and the points P1 and P2 are arranged within the microlenses 20a and 20b respectively at the same relative position the light beams or photons from the points P1 and P2 meet at the same location in the pupil plane PP. Accordingly any parallel displacement of the joining line P1P2 over the microlens array 20 in FIG. 2a results in the joining of two points from which there go light beams which meet or are in mutually superposed relationship on the same location in the pupil plane PP.

As can best be seen from FIG. 2b in accordance with the disclosure the depolarisation period D1 of the Hanle depolariser 10 is now matched or adapted to the periodicity of the microlens array. That matching is effected in such a fashion that a suitable choice with respect to the depolarisation period D1 of the Hanle depolariser 10 provides that the light beams passing through the points P1 and P2 in the microlens array 20 (and thus in mutually superposed relationship in the pupil plane PP) involve orthogonal polarisation states. Accordingly that provides that the light beams respectively impinging at the same location in the pupil plane PP bear orthogonal polarisation states, which results in unpolarised light as a result of superpositioning in the pupil plane PP.

Referring to FIG. 2b that matching of the depolarisation period D1 of the Hanle depolariser 10 to the periodicity of the microlens array 20 corresponds to the condition:

$$D1 = 2*a*\cos\alpha \qquad (2),$$

wherein a denotes the periodicity of the microlens array 20 and a denotes the rotational angle of the microlens array with respect to the x-axis (in the illustrated example α=15°.

The depolarisation period DP of the Hanle depolariser 10 results from the wedge angle γ of the Hanle depolariser 10 in accordance with the following relationship (3):

$$\gamma = \arctan((\lambda/\Delta n)/DP) \quad (3)$$

Therein Δn denotes the difference $n_o - n_e$ between the ordinary refractive index $n_o$ and the extraordinary refractive index $n_o - n_e$, so that in the illustrated example, for crystalline quartz, with a wavelength of λ=193.36 nm, the difference Δn=0.13465. In some embodiments, a value of about a≈1.9 nm is selected for the periodicity of the microlens array 20. In accordance with equation (2) that gives a value of D1≈3.68 mm for DP=D1, that is to say for the basic depolarisation period D1 of the Hanle depolariser 10. Further depolarisation periods DP which are also appropriate are given by $D1/3^N$, wherein N is a natural number greater than zero. In other words values of the depolarisation period DP of the Hanle depolariser 10, which lead to the effect which is desired in accordance with the disclosure, also occur at a third, a ninth etc. of the basic depolarisation period D1, that is to say with:

$$DP = \frac{D1}{3^N}, (N = 0, 1, 2, \ldots) \quad (4)$$

If a value of D1/3 is selected for the depolarisation period, then a value γ=40' (minutes of arc) and 14" (seconds of arc) is afforded from equation (3) for the wedge angle if the depolariser used is a Hanle depolariser which is composed of a birefringent wedge (with an angle of 45° between the optical crystal axis of the birefringent material and the vibration direction of the electrical field strength vector of the linearly polarised light coming from the laser source) as well as a compensating wedge.

In general terms therefore the depolarisation period DP of the depolariser is selected in such a way that the condition:

$$DP = (2*a*\cos \alpha)/3^N, (N=0,1,2,\ldots) \quad (5)$$

is satisfied, wherein the corresponding wedge angle γ is ascertained from equation (3). In regard to the wedge angle γ which is to be ascertained in that way, a deviation of up to 5 percent (e.g., up to 2 percent, up to 1 percent), is considered to be acceptable or embraced by the present disclosure.

Figure 3:
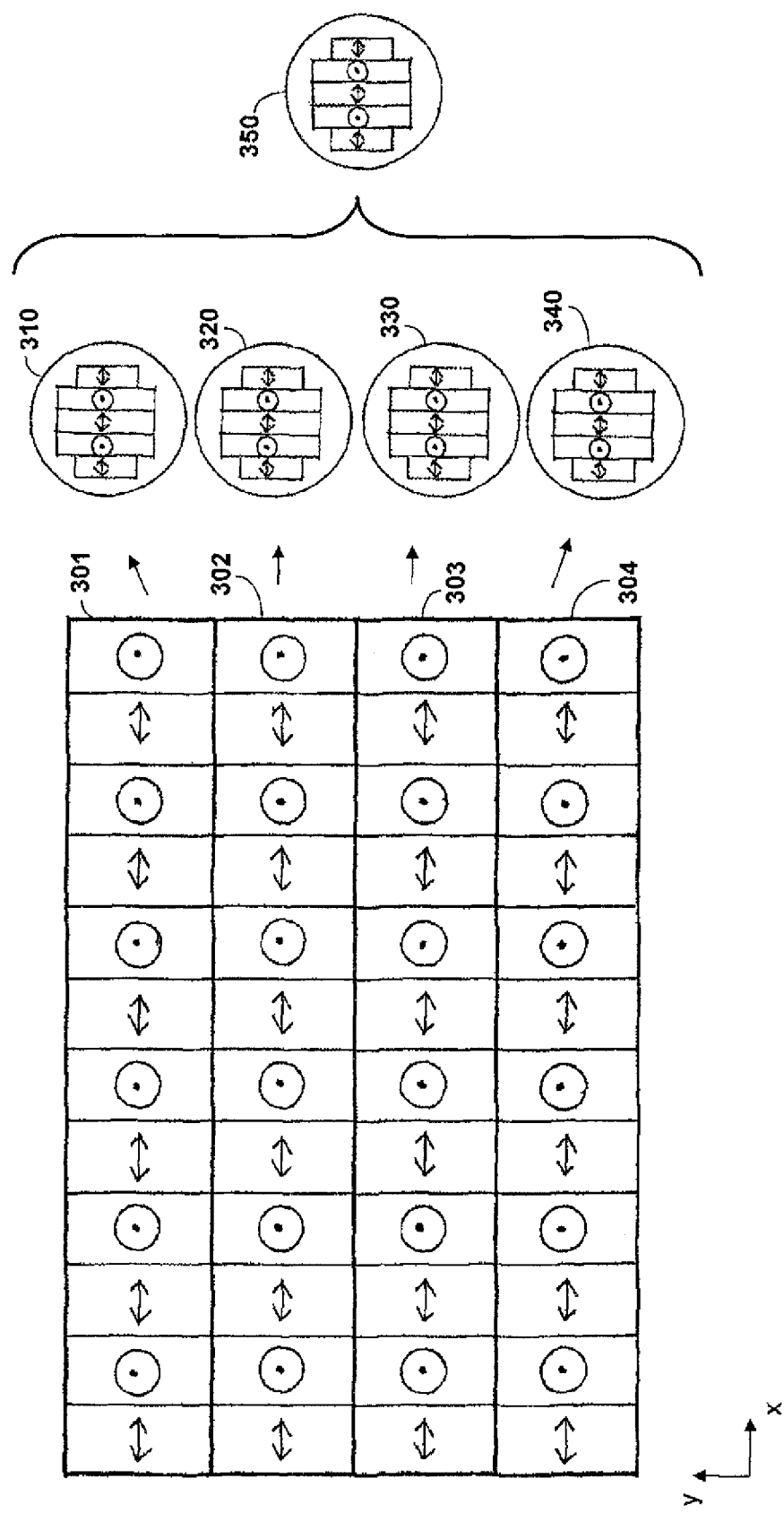
FIGS. 3-4 show diagrammatic views to describe a depolariser for reducing or avoiding the local variation involved as shown in FIG. 1 in the residual polarisation in the pupil plane.
Figure 4:
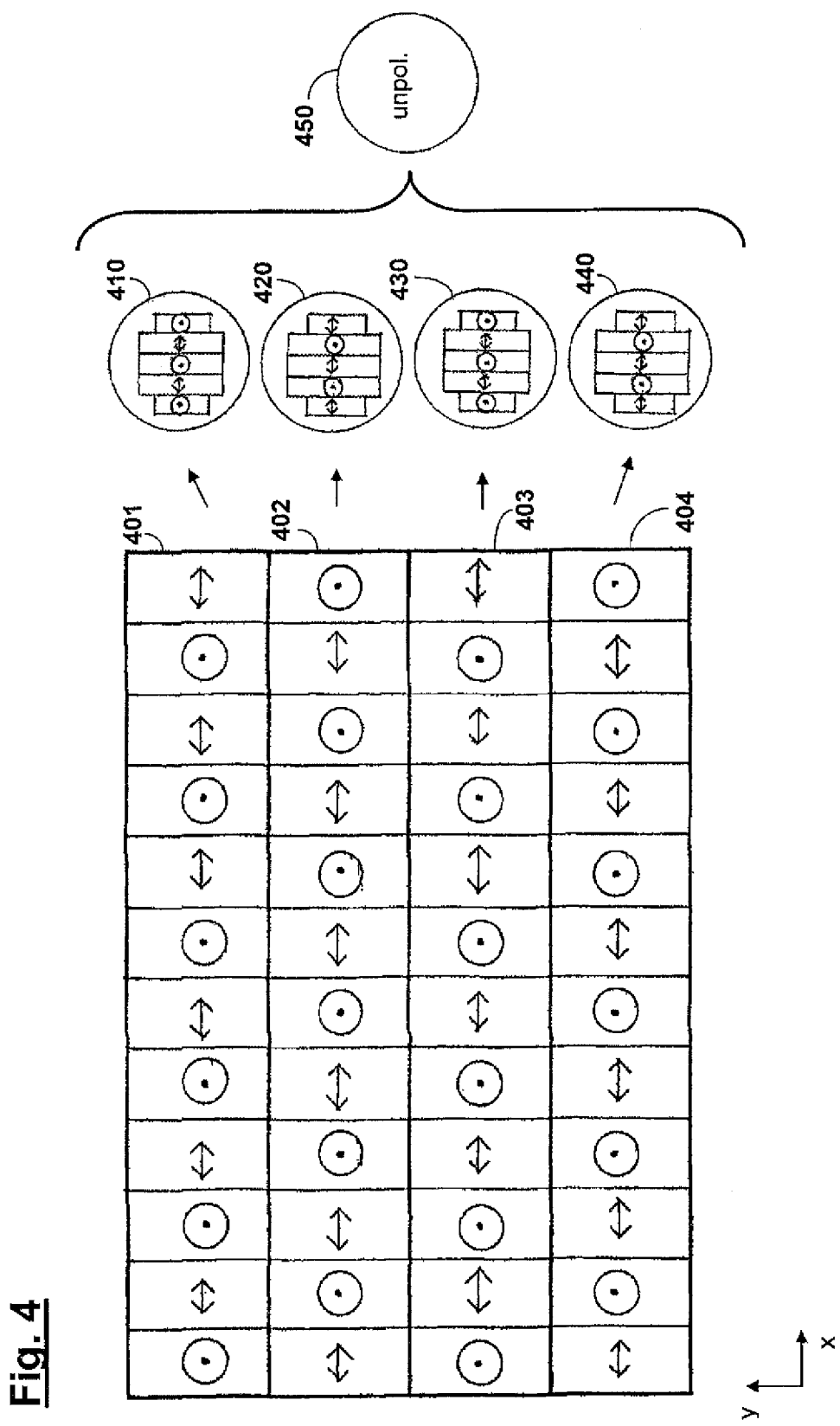

In FIGS. 3 and 4 the above-discussed concept of superpositioning of mutually orthogonal polarisation states in the pupil plane PP can also be effected without adaptation of the depolarisation period of the Hanle depolariser in the x-direction to the periodicity of the microlens array 20 if instead in a similar fashion in a direction perpendicular to the wedge direction (that is to say in the y-direction) an alternate sequence of orthogonal polarisation states is set. That is effected in such a way that in addition a step-like variation in the polarisation state is produced in that y-direction in such a way that the input polarisation is rotated through 90° in each case after a constant distance $y_0$.

In some embodiments, to produce that step-like variation in the polarisation state, the depolariser can be so structured that it still involves a wedge configuration in the x-direction, but in the y-direction it has such steps (produced for example by etching) that between successive steps there is an effective retardation difference of lambda/2 (or an odd multiple thereof). For that purpose for example in a modification of FIG. 1 the flat light entry surface of the wedge plate can be provided by etching in that way with a structure consisting of recesses and raised portions in stripe form which follow each other in the y-direction. In the case of production of the wedge plate of the depolariser from crystalline quartz the desired retardation difference of lambda/2 between a recess and the following raised portion can be set by etching of a recess in stripe form, of a depth of about 7 μm. In accordance with an certain embodiments the setting of a stepped sequence of regions with a retardation difference or a relative path difference of lambda/2 relative to each other can also be achieved by an additional element of optically active material (for example crystalline quartz with an orientation of the optical crystal axis in parallel relationship with the optical system axis of the illumination system). In that case the thickness profile of that additional element varies in the direction of the optical crystal axis in such a way that regions in stripe form and in which the rotational angle of the preferred polarisation direction differs from each other through 90° occur in succession in the y-direction.

The effect which is acquired in that respect is illustrated by FIGS. 3 and 4, wherein FIG. 3 shows the addition of subpupils 310, 320, 330 and 340 which are respectively produced by the above-described regions, 301, 302, 303 and 304 of the Hanle depolariser, which occur in succession in the y-direction and which extend in stripe form in the x-direction, on the one hand, in combination with the microlens array which follows in the light propagation direction, on the other hand.

As a consequence of the matching of the depolarisation period of the Hanle depolariser to the periodicity of the microlens array, which is not involved in FIGS. 3 and 4, the subpupils 310 to 340 and 410 to 440 respectively which are respectively obtained as shown in FIGS. 3 and 4 each exhibit a moiré pattern. While as shown in FIG. 3 those moiré patterns are added in the polarisation distribution 350 obtained by superpositioning of the sub-pupils 310 to 340 to afford a residual polarisation distribution which varies locally in the pupil plane (or a resulting moiré pattern), the addition of the sub-pupils 410 to 440 as shown in FIG. 4, as a consequence of the above-described step function additionally produced in the y-direction, leads to a polarisation distribution 450 with effectively unpolarised light.

FIGS. 5-9 are also based on the concept of preventing the production of periodic superpositioning structures in residual polarisation with superpositioning occurring with respect to the effects of the Hanle depolariser 10 on the one hand and of the microlens array 20 on the other hand.

In FIGS. 5-9, preventing the production of periodic superpositioning structures is not effected by matching the depolarisation period of the Hanle depolariser to the periodicity of the microlens array, but rather is effected by the depolarising action of the depolariser being of such a nature from the outset that there is no association, which leads to a periodic superpositioning structure, as between the polarisation states (or polarisation stripes) which are set by the depolariser on the one hand and the respective positions on the microlenses of the microlens array on the other hand.

As is described hereinafter an association which leads to a periodic superpositioning structure can be prevented on the one hand by the variation in the polarisation state, which is produced by the depolariser, being set to be aperiodic (see hereinafter FIGS. 5 to 7). In addition the desired effect of preventing a local variation in residual polarisation or a periodic superpositioning structure in the pupil plane can also be achieved by the lines of equal retardation of the depolariser not extending straight but curved or on an arc (see FIGS. 8 and 9). Both cases provide that beams which experience the same retardation effect in the depolariser pass through different microlenses of the microlens array at different relevant positions (that is to say at positions which are not spaced from each other by an integral multiple of the periodicity of the microlens array). Rather, beams which experience the same retardation effect in the depolariser or which involve the same polarisation state pass through each microlens of the microlens array at different relative positions, whereby as a result a local variation in the residual polarisation distribution in the pupil plane (or a periodic superpositioning structure, a beat effect or a moiré pattern) is also prevented.

Figure 5:
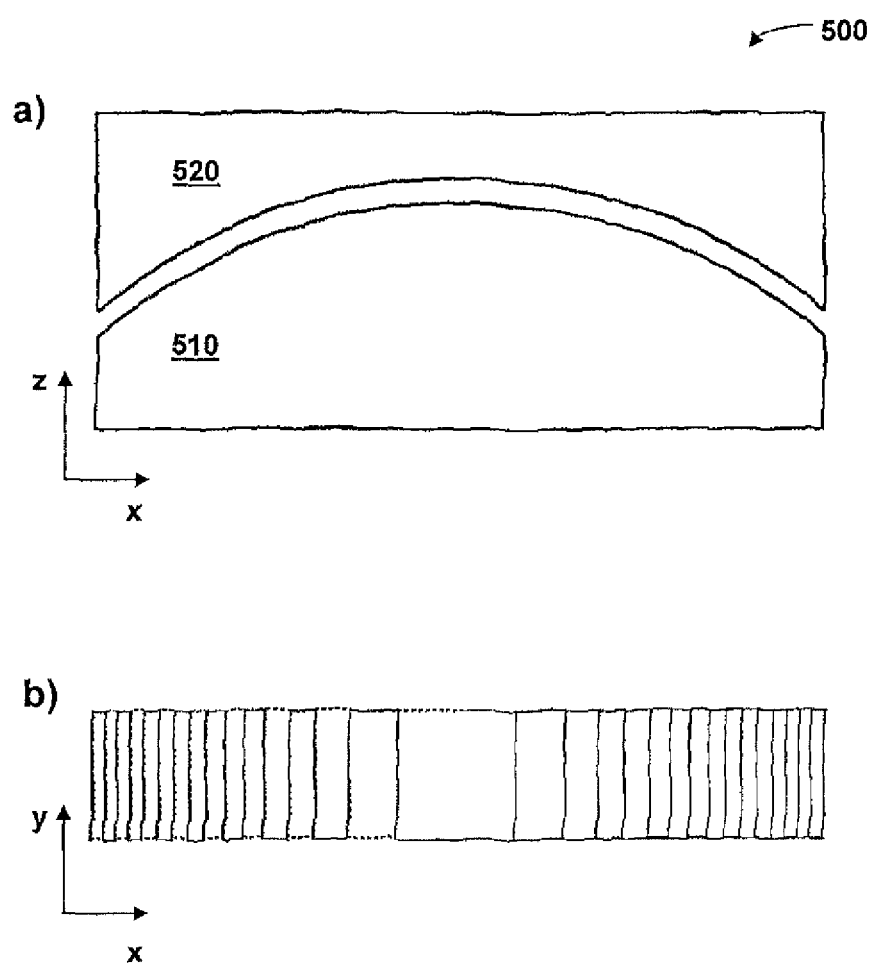

FIGS. 5a to 5b show a depolariser 500 which, unlike the Hanle depolariser 10 of FIG. 1, is not formed from wedge plates but from cylindrical lenses 510 and 520. Moreover the orientation of optical crystal axes in the cylindrical lenses 510 and 520 which in turn are made from birefringent material extends similarly to the respective orientations of the Hanle depolariser 10 shown in FIG. 1. The second cylindrical lens 520 serves for compensation of the beam deflection caused by the first cylindrical lens 510 and consequently is of a complementary configuration thereto so that the two cylindrical lenses 510 and 520 supplement each other overall to afford a plane-parallel geometry. It will be appreciated that, in a modification of FIG. 5, the second cylindrical lens 520, just as in FIG. 1, can also be produced from optically isotropic material (for example quartz glass).

FIG. 5b is a diagrammatic view showing the change in the polarisation state, which is obtained by the depolariser 500 shown in FIG. 5a. In this respect once again similarly to FIG. 1 the polarisation distribution which is afforded downstream of the depolariser 500 in the light propagation direction is shown in diagrammatically simplified form as a stripe pattern including regions with a mutually orthogonal preferred polarisation direction. It will be seen that the width (or extent in the x-direction) of those stripes decreases quadratically with increasing distance from the central position of the depolariser 500.

Figure 6:
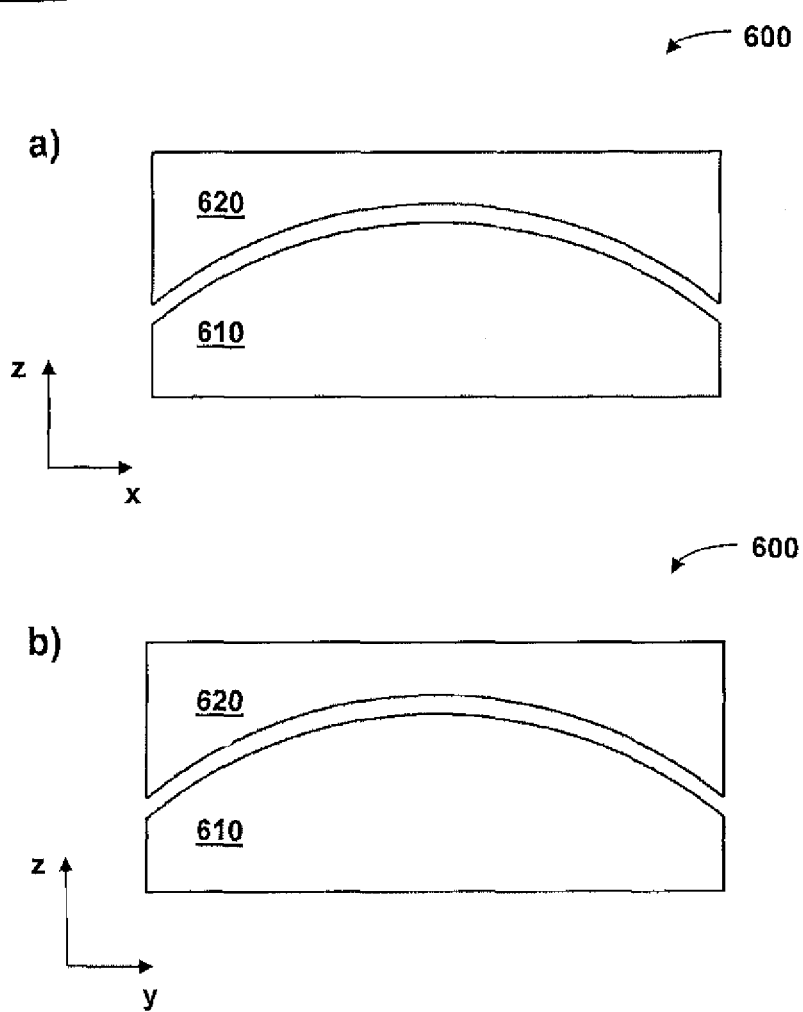

As shown in FIG. 6, a depolariser 600 can also be made from spherical lenses, that is to say a plano-convex lens 610 and a plano-concave lens 620 of birefringent material with crystal orientations which are similar to FIG. 1 and FIG. 5 respectively. This configuration of the depolariser 600 is advantageous in particular from production engineering points of view, more specifically in regard to easier production of the plano-concave lens 620 in complementary relationship with the plano-convex lens 610.

The optical crystal axes in the lenses 610 and 620 respectively are again arranged in the plane perpendicular to the optical system axis of the illumination system and at an angle of 90° relative to each other, similarly to FIG. 1 and FIG. 5.

The above-described configuration of the depolariser which provides that a local variation in the spacing of positions of equal retardation effect over the extent of the depolariser is attained is not restricted to the described constitutions of the depolariser from cylindrical lenses or spherical lenses. Rather, the lens elements which are assembled to produce the depolariser, including birefringent material, can also be of any other form which is so selected that the change in the thickness profile, which ultimately is responsible for the depolarising action, is non-linear in a direction radial with respect to the optical axis. In general terms that can also be achieved by an optically operative interface of the depolariser being in the form of a free form surface. In that respect the only important consideration in terms of correcting the beam deflection is that the production of a complementary counterpart portion is successful (similarly to the plano-concave lenses 620 of FIG. 6 or the cylindrical lens 520 of FIG. 5). FIG. 7 is a diagrammatic view of a depolariser 700 designed with free form interfaces.

Figure 8:
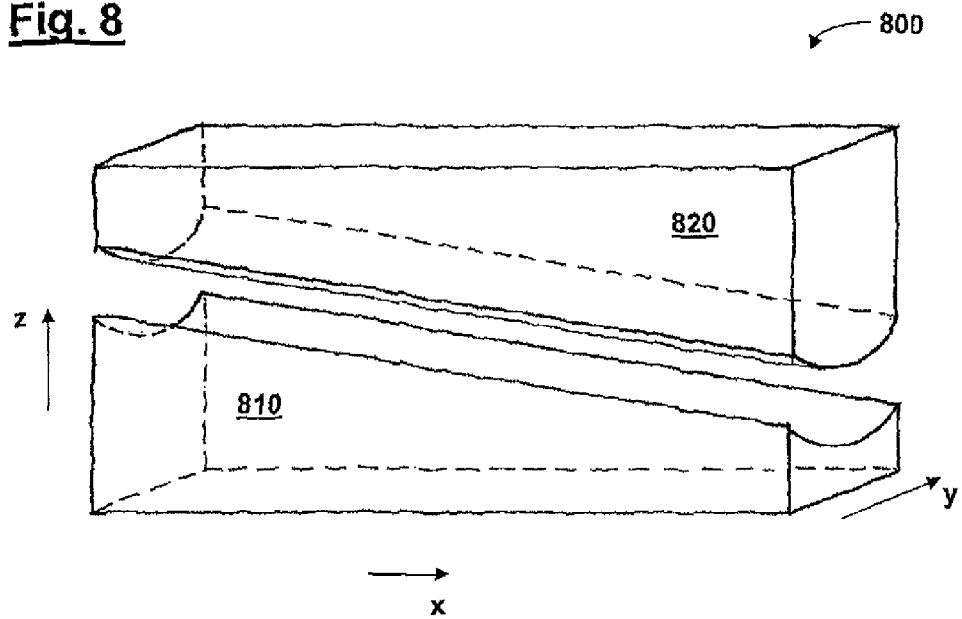

As shown in FIG. 8, a depolariser 800 has a first lens element 810 which is again of a cross-section which is wedge-shaped in the x-direction but on which a cylindrical geometry is superposed. That means that, when viewing in the xz-section, the thickness of the lens element 810 (measured in the z-direction) decreases linearly along the positive x-axis, but at the same time when viewing in the yz-section, the extent of the lens element 810 in the z-direction respectively exhibits a quadratic dependency on the y-coordinate. The second lens element 820 is again in complementary relationship with the first lens element 810 for the purposes of compensating for beam deflection in the first lens element 810 so that the first and second lens elements 810, 820 again supplement each other to afford a plane-parallel geometry.

The orientation of the optical crystal axes in the lens elements 810 and 820 is selected to be similar to the above-described embodiments, that is to say those optical crystal axes are again in the plane perpendicular to the optical system axis OA of the illumination system and include an angle of 90° with each other. Furthermore as shown in FIG. 8 the second lens element 820 can also be produced alternatively from optically isotropic material (for example quartz glass).

The consequence of the design configuration of the depolariser 800 is that, unlike the conventional double wedge in which the retardation is constant in magnitude and orientation along the x-direction, a retardation which is positionally dependent in magnitude and direction both in the x-direction and also in the y-direction is achieved. In other words the lines of equal retardation (also referred to as "depolarisation stripes") extend in a curved configuration as the positions on the first depolariser element 810, with respect to which the beams passing therethrough experience the same retardation effect, lie on a non-linear curve or an arc. Similarly to the embodiments described hereinbefore with reference to FIGS. 5-7 that also provides that those light beams of equal retardation pass through the individual lenses 20a, 20b, 20c of the microlens array 20 at relative positions which are different from each other. Consequently once again that provides for the desired prevention of a periodic superpositioning structure arising out of the interaction between the depolariser on the one hand and the microlens array on the other hand.

Figure 9:
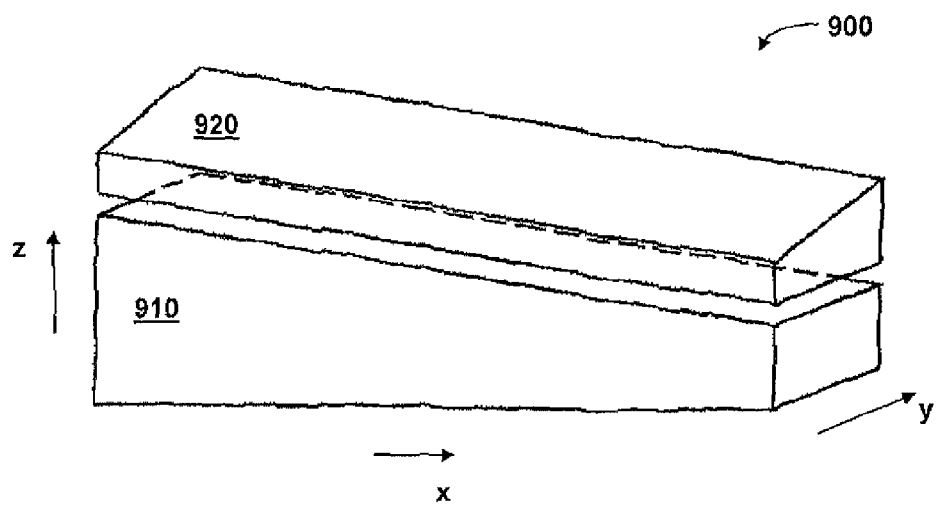

FIG. 9 shows a depolariser 900. The depolariser 900 once again includes a first subelement 910 which similarly to the Hanle depolariser 10 of FIG. 1 is in the form of a wedge plate of linearly birefringent material (for example crystalline quartz with an optical crystal axis extending in perpendicular relationship to the light propagation direction or to the optical system axis OA). The depolariser 900 further includes a second subelement 920 which (as a "rotator wedge") is made of optically active material, for example crystalline quartz with an optical crystal axis extending in parallel relationship to the light propagation direction or the optical system axis, wherein the wedge configurations of the second subelement 920 and of the first subelement 910 are in mutually perpendicular planes. In FIG. 9 the wedge configuration of the second subelement 920 is in the y-direction whereas the wedge configuration of the first subelement 910 is in the x-direction.

Correction of the beam deflection caused by the first subelement 910 and the second subelement 920 can be effected by a further compensation element (not shown) of optically isotropic material (for example quartz glass). The design configuration of the depolariser 900 in FIG. 9 also provides a positionally dependent retardation effect both in the x-direction and in the y-direction. Just as in FIGS. 5-8 the consequence of this is that light beams which experience the same retardation effect in the depolariser 900 pass through the individual microlenses 20a, 20b, 20c, . . . of the microlens array 20 at different locations so that an association, which leads to a periodic superpositioning pattern, as between positions within the microlenses 20a, 20b, 20c, . . . of the microlens array 20 on the one hand and the polarisation states produced by the depolariser 900 on the other hand is prevented.

Even if the disclosure has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present disclosure and the scope of the disclosure is limited only in the sense of the accompanying claims and equivalents thereof.

What is claimed is:

1. An illumination system, comprising:
   a depolariser;
   a light mixing system disposed downstream of the depolarizer in a light propagation direction; and
   a member arranged upstream of the light mixing system in the light propagation direction, the member comprising a plurality of elements arranged with a periodicity;
   wherein during use:
      the depolarizer in conjunction with the light mixing system at least partially causes effective depolarisation of polarised light impinging on the depolariser;
      the depolariser produces a succession of mutually orthogonal polarisation states during use;
      the succession of mutually orthogonal polarisation states is periodic over its cross-section and can be described by a depolarisation period;
      the depolarisation period is adapted to the periodicity of the elements of the member so that at least two light beams which impinge on mutually adjacent elements of the member at positions whose spacing from each other corresponds to the periodicity of the elements of the member bear mutually orthogonal polarisation states;
      a contribution due to interaction of the depolariser with the periodicity of the elements of the member to a residual polarisation distribution occurring in a pupil plane, which is arranged in the illumination system downstream of the member in the light propagation direction, has a maximum degree of polarisation of not more than 5%; and
      the illumination system is configured to be used in a microlithographic projection exposure apparatus.

2. An illumination system according to claim 1, wherein, during use, the member produces an angular distribution in the light beams.

3. An illumination system according to claim 1, wherein at least some of the elements of the member are disposed in an array.

4. An illumination system according to claim 1, wherein the contribution to the residual polarisation distribution occurring in the pupil plane has a maximum degree of polarisation of not more than 2%.

5. An illumination system according to claim 1, wherein the contribution to the residual polarisation distribution occurring in the pupil plane has a maximum degree of polarisation of not more than 1%.

6. An illumination system according to claim 1, wherein the depolarisation period is adapted to the periodicity of the elements of the member so that at least two light beams which are in mutually superposed relationship after passing through mutually adjacent elements of the member in the pupil plane bear mutually orthogonal polarisation states.

7. An illumination system according to claim 1, wherein the depolarisation period satisfies the condition:

$$DP = (2 * a * \cos \alpha)/3^N$$

wherein a denotes the periodicity of the elements of the member, a denotes an angle between the member and a plane perpendicular to an optical system axis of the illumination system (with $\alpha \geq 0$), DP denotes the depolarisation period and N denotes an integer of greater than or equal to zero.

8. An illumination system according to claim 1, wherein the depolariser comprises birefringent material and has a thickness profile which varies over its cross-section perpendicularly to an optical system axis of the illumination system.

9. An illumination system according to claim 1, wherein the depolariser has at least one wedge-shaped portion of birefringent material with a light exit surface extending at a wedge angle to its light entry surface.

10. An illumination system according to claim 9, wherein the depolariser is designed so that in a direction perpendicular to the wedge direction it produces an alternate sequence of mutually orthogonal polarisation states.

11. An illumination system according to claim 10, wherein the alternate sequence of mutually orthogonal polarisation states is achieved by a variation in the thickness profile of the depolariser in a direction perpendicular to the wedge direction.

12. An illumination system according to claim 10, wherein the alternate sequence of mutually orthogonal polarisation states is achieved by a region of optically active material with a thickness profile which varies in the direction of an optical system axis of the illumination system.

13. An illumination system according to claim 1, wherein the elements of the member comprise refractive elements.

14. An illumination system according to claim 1, wherein the elements of the member comprise diffractive elements.

15. An illumination system according to claim 1, wherein the member is arranged downstream of the depolariser in the light propagation direction.

16. An illumination system according to claim 1, wherein the polarised light impinging on the depolariser is linearly polarised light.

17. An apparatus, comprising:
   an illumination system; and
   a projection objective,
   wherein the illumination system comprises:
      a depolariser;
      a light mixing system disposed downstream of the depolarizer in a light propagation direction; and
      a member arranged upstream of the light mixing system in the light propagation direction, the member comprising a plurality of elements arranged with a periodicity,
   wherein during use:
      the depolarizer in conjunction with the light mixing system at least partially causes effective depolarisation of polarised light impinging on the depolariser;
      the depolariser produces a succession of mutually orthogonal polarisation states during use;
      the succession of mutually orthogonal polarisation states is periodic over its cross-section and can be described by a depolarisation period;
      the depolarisation period is adapted to the periodicity of the elements of the member so that at least two light beams which impinge on mutually adjacent elements of the member at positions whose spacing from each other corresponds to the periodicity of the elements of the member bear mutually orthogonal polarisation states; and a contribution due to interaction of the depolariser with the periodicity of the elements of the member to a residual polarisation distribution occurring in a pupil plane, which is arranged in the illumination system downstream of the member in the light propagation direction, has a maximum degree of polarisation of not more than 5%, and wherein the apparatus is a microlithographic projection exposure apparatus.

18. An apparatus according to claim 17, wherein, during use, the member produces an angular distribution in the light beams.

19. A process, comprising:

manufacturing microstructured components using a microlithographic exposure apparatus, wherein the microlithographic exposure apparatus comprises an illumination system, the illumination system comprising:
  a depolariser;
  a light mixing system disposed downstream of the depolarizer in a light propagation direction; and
  a member arranged upstream of the light mixing system in the light propagation direction, the member comprising a plurality of elements arranged with a periodicity, and wherein during the process:
  the depolarizer in conjunction with the light mixing system at least partially causes effective depolarisation of polarised light impinging on the depolariser;
  the depolariser produces a succession of mutually orthogonal polarisation states during use;
  the succession of mutually orthogonal polarisation states is periodic over its cross-section and can be described by a depolarisation period;
  the depolarisation period is adapted to the periodicity of the elements of the member so that at least two light beams which impinge on mutually adjacent elements of the member at positions whose spacing from each other corresponds to the periodicity of the elements of the member bear mutually orthogonal polarisation states;
  a contribution due to interaction of the depolariser with the periodicity of the elements of the member to a residual polarisation distribution occurring in a pupil plane, which is arranged in the illumination system downstream of the member in the light propagation direction, has a maximum degree of polarisation of not more than 5%.

20. The process of claim 19, comprising:

projecting at least a part of a mask having structures onto a region of a layer of a light-sensitive material.

* * * * *

UNITED STATES PATENT AND TRADEMARK OFFICE
CERTIFICATE OF CORRECTION

PATENT NO. : 8,928,859 B2  
APPLICATION NO. : 13/564419  
DATED : January 6, 2015  
INVENTOR(S) : Damian Fiolka et al.

Page 1 of 1

It is certified that error appears in the above-identified patent and that said Letters Patent is hereby corrected as shown below:

In the Specification

Col. 5, line 63, delete "that that" and insert -- that --.

Col. 7, line 2, delete "a" and insert -- α --.

Col. 7, line 3, delete "15°." and insert -- 15°). --.

In the Claims

Col. 12, line 8, Claim 7, delete "a" and insert -- α --.

Signed and Sealed this
Twenty-sixth Day of May, 2015

Michelle K. Lee
*Director of the United States Patent and Trademark Office*